United States Patent [19]

Nishimori

[11] Patent Number: 5,206,584

[45] Date of Patent: Apr. 27, 1993

[54] TEST CIRCUIT FOR TESTING A THREE-STATE OUTPUT BUFFER GATE IN A SEMICONDUCTOR INTEGRATED CIRCUIT

[75] Inventor: Hiroaki Nishimori, Tokyo, Japan

[73] Assignee: NEC Corporation, Tokyo, Japan

[21] Appl. No.: 824,217

[22] Filed: Jan. 22, 1992

[30] Foreign Application Priority Data

Feb. 1, 1991 [JP] Japan .................................. 3-11808

[51] Int. Cl.$^5$ ............................................ G01R 31/28
[52] U.S. Cl. ................................ 324/158 R; 324/73.1; 371/15.1
[58] Field of Search ..................... 324/73.1, 158 R; 371/22.1, 6, 22.6, 15.1, 22.3, 22.4; 307/473, 465

[56] References Cited

U.S. PATENT DOCUMENTS 4,782,283 11/1988 Zasio .................................. 371/22.3
5,084,874 1/1992 Whetrel, Jr. ....................... 371/22.4

Primary Examiner—Vinh Nguyen
Attorney, Agent, or Firm—Sughrue, Mion, Zinn, Macpeak & Seas

[57] ABSTRACT

A semiconductor integrated circuit provided with a test circuit for testing an output buffer (11) is disclosed. The test circuit is capable of transmitting a logic signal supplied from an internal circuit in a shorter transmission time than a conventional test circuit. Essential parts of the test circuit include a three-state input buffer (13) and a three-state buffer (14). In the test mode, buffer (14) takes a high-impedance state and buffer (13) transmits a test data signal (TSTD) supplied from an external circuit to output buffer (11) to be tested. In the output mode, buffer (13) takes a high-impedance state and buffer (14) transmits a logic signal supplied from an internal logic circuit to an external circuit through output buffer (11).

2 Claims, 3 Drawing Sheets

TEST CIRCUIT FOR TESTING A THREE-STATE OUTPUT BUFFER GATE IN A SEMICONDUCTOR INTEGRATED CIRCUIT

BACKGROUND OF THE INVENTION

1. Field of the Invention

The present invention relates to a semi-conductor integrated circuit and in particular to a semiconductor integrated circuit provided with a test circuit for testing an output buffer gate.

2. Description of the Prior Art

It is usual that a semiconductor integrated circuit, after manufacture, is subjected to DC, AC and function tests to ascertain the conformity of the circuit with DC and AC standards and also to check performance characteristics of the overall circuit. Of these tests a DC test is our present concern.

The DC test includes tests of an input buffer gate, an output buffer gate, and a bidirectional buffer gate (an input/output buffer gate). For brevity, a buffer gate will be referred to as a buffer below. Among these DC tests, the test of an input buffer can be easily performed by applying a test-data signal (a test pattern) fed from an external circuit directly to the input buffer to be tested. A test of an output buffer, however, is not so easy as that of the input buffer, because test-data signals have to be supplied from an internal circuit of the semiconductor integrated circuit, and it is usually difficult to apply test patterns to the internal circuit and control the internal circuit so as to allow the output buffer to provide an output of a predetermined state by means of an appropriate combination of a test-data signal and a control signal supplied from the internal circuit. (A typical test of a buffer is to measure a current and a voltage in the buffer to be tested at a time when the buffer provides an output of a predetermined state.) This difficulty increases as a circuitry of the internal circuit becomes more complicated. In order to avoid this difficulty, it has been proposed that the semiconductor integrated circuit internally have a test circuit capable of selecting one of two modes, a test mode and an output mode, in response to a mode-selecting signal or a test-mode signal supplied from an external circuit. In the test mode, an externally supplied test-data signal is fed to the output "buffer" to be tested, and in the output mode, a signal delivered from the internal circuit is transmitted to a given external circuit through the output buffer.

FIG. 1 shows a block diagram of a semiconductor integrated circuit provided with a conventional test circuit of the type described above, and FIG. 2 shows a block diagram of a multiplexer employed in the test circuit shown in FIG. 1.

A three-state buffer is inserted in the test circuit as output buffer 1 to be tested. The main part of the test circuit comprises two multiplexers 6A and 6B. Multiplexer 6A receives logic signal Q delivered from an internal logic circuit (not shown) at first data input D1 and a test-data signal (hereafter referred to as "TSTD") transmitted from an external circuit through TSTD terminal 3 and input buffer 8 at second data input D2, and selects one of the two data signals in response to the test-mode signal (hereafter referred to as"TST") applied to the control-input terminal A, to provide a data input to three-state output buffer 1. TST is supplied, from an external circuit through TST terminal 2 and input buffer 7. Similarly, multiplexer 6B is fed at data inputs D1, D2 with two control signals, i.e., control signal C supplied from the internal logic circuit and a test-control signal (hereafter referred to as "TSTC") supplied from an external circuit through TSTC terminal 4 and input buffer 9. These control signals act as an output-enable signal for the output buffer 1. Multiplexer 6B selects one of the two control signals in response to TST applied to control input terminal A to provide a control input of output buffer 1.

Both multiplexers 6A, 6B have an identical circuitry. Each multiplexer is composed of AND gates 61, 62, OR gate 63 and inverter 64 as shown in FIG. 2. Since TST and inverted TST are supplied to one of the inputs of each AND gate 61, 62, respectively, two AND gates 61, 62 work complementarily to each other in response to TST. As a result, when TST is at logic 1, AND gate 61 is allowed to transmit data input D1 which is subsequently delivered to output buffer 1 through OR gate 63, while AND gate 62 is inhibited from transmitting data input D2. Conversely, when TST is at logic 0, data input D2 is delivered to output buffer 1.

The construction of the test circuit above leads to the operation below. In the output mode, TST is set at logic 1, thus logic signal Q and control signal C are selected by multiplexer 6A and 6B, respectively, to be delivered as a data signal and a control signal, respectively, to three-state output buffer 1, whereby output buffer allows logic signal Q to transmit to the external circuit under control of control signal C, provided that output buffer 1 functions correctly, while TSTD is shut out from the output buffer. In the test mode, when TST is set at logic 0, it causes logic signal Q and control signal C to be shut out from output buffer 1, while TSTD and TSTC are allowed to transmit to output buffer 1, which allows TSTD to transmit to output terminal 5 under control of TSTC, provided that output buffer 1 functions correctly. Combining TSTD and TSTC appropriately, output terminal 5 can easily be set in any state of logic 1, logic 0 and high impedance.

Table 1 is a truth table of the logic state at output terminal 5 for various logic levels of signals Q, C, TST, TSTD, and TSTC. In the table, HZ and X stand for "high-impedance" and "irrelevant" (or "don't care") conditions. Since, by employing a test circuit as described above, output terminal 5 is easily set at any logic state optionally in accordance with the truth table, a test of DC characteristic of a three-state output buffer can be performed easily.

TABLE 1

| Q | C | TST | TSTD | TSTC | Terminal 5 |
|---|---|-----|------|------|------------|
| 1 | 1 | 0 | X | X | 1 |
| 0 | 1 | 0 | X | X | 0 |
| X | 0 | 0 | X | X | HZ |
| X | X | 1 | 1 | 1 | 1 |
| X | X | 1 | 0 | 1 | 0 |
| X | X | 1 | X | 0 | HZ |

In the semiconductor integrated circuit with a conventional test circuit as set forth above, separation of transmissions of signal Q and TSTD is achieved by multiplexers 6A and 6B. This separation leads, however, to a problem in that in the output mode the multiplexer disposed on the transmission line of signal Q causes a delay in the transmission.

SUMMARY OF THE INVENTION

It is an object of the present invention to provide a semiconductor integrated circuit provided with a test circuit for testing an output buffer of a short transmission-time characteristic.

It is another object of the present invention to provide a semiconductor integrated circuit provided with a test circuit for testing a three-state output buffer having a short transmission-time characteristic.

It is a further object of the present invention to provide a semiconductor integrated circuit provided with a bidirectional test circuit for testing a bidirectional buffer having a short transmission-time characteristic.

In order to attain the first object above, the test circuit comprises a first input buffer gate for transmitting an externally supplied test-mode signal to the test circuit, a first three-state buffer gate which serves as a second input buffer gate for transmitting an externally supplied test-data signal to the output buffer gate, and a second three-state buffer gate. The output of the first three-state buffer gate is connected to the data input of the output buffer gate and the control input of the first three-state buffer gate is connected to the output of the first input buffer gate so that the first thee-state buffer gate is controlled to take a high-impedance state when the test-mode signal is at a first logic level, and to transmit a test-data signal to the output buffer gate when the test-mode signal is at a second logic level.

The data input of the second three-state buffer gate is fed with a logic signal Q supplied from an internal logic circuit of the semiconductor integrated circuit, the output is connected to the data input of the output buffer gate, and a control input is connected to the output of the first input buffer gate so that the second three-state buffer gate is controlled to transmit the logic signal Q to the output buffer gate when the test-mode signal is at the first logic level, and to take a high-impedance state when the test-mode signal is at the second logic level.

In order to attain the second object of the present invention, the test circuit further comprises third and forth three-state buffer gates for providing a control signal for the three-state output buffer gate. The third three-state buffer gate has a data input supplied with a control signal C fed from the internal logic circuit and a control input connected to the output of the first input buffer gate, and is controlled to transmit the control signal C to the control input of the output buffer gate when the test-mode signal is at the first logic level, and to take a high-impedance state when the test-mode signal is at a second logic level. The fourth three-state buffer gate is a third input buffer gate for transmitting an externally supplied test-control signal to the control input of the output buffer gate, and has a control input connected to the output of the first input buffer gate, and is controlled to take a high-impedance state, when the test-mode signal is at the first logic level, and to transmit the test-control signal when the test-mode signal is at the second logic level.

In order to attain the third object of the present invention, the test circuit further includes a fourth input buffer gate which provides a bidirectional buffer gate in combination with tho output buffer gate and receives an external signal transmissive in the opposite direction, and gate means which transmits the output of the fourth input buffer gate, only when neither the logic signal Q nor the test-data signal is delivered from the output buffer gate.

BRIEF DESCRIPTION OF THE DRAWING

The invention disclosed herein will be better understood with reference to the following drawings in which.

DESCRIPTION OF THE PREFERRED EMBODIMENTS

Figure 3:
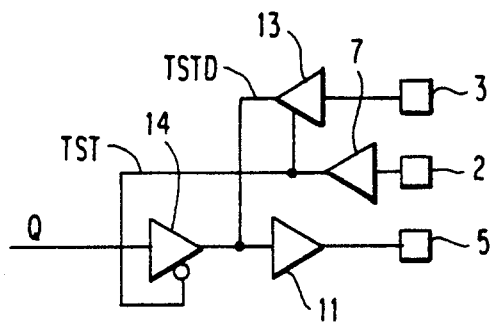
FIG. 3 is a block diagram of a first embodiment of the semiconductor integrated circuit according to the present invention for testing a two-state output buffer.

FIG. 3 is a block diagram of a first embodiment of the semiconductor integrated circuit provided with a test circuit according to the present invention for testing a two-state output buffer 11. The test circuit comprises TST terminal 2 input buffer 7 for receiving TST, TSTD terminal 3, signal output terminal 5, which are identical with those already shown in FIG. 1, and three-state buffers 13 and 14. Three-state buffer 13 is essentially an input buffer for transmitting TSTD to output buffer 11 to be tested, and is controlled by TST so that it transmits TSTD to output buffer 11 when TST is at logic 1, and takes a high-impedance state to shut off TSTD from output buffer 11 when TST is at logic 0.

Three-state buffer 14 is fed with logic signal Q from the internal logic circuit (not shown) to its data input, and its output is coupled to output buffer 11. Buffer 14 is also controlled by TST so that it transmits logic signal Q when TST is at logic 0 and takes a high-impedance state to shut off logic signal Q from output buffer 11 when TST is at logic 1. In this manner, in the output mode (TST=logic 0) logic signal Q is transmitted from the internal logic circuit to an external circuit through output buffer 11 and signal output terminal 5, and in the test mode (TST=logic 1), TSTD is applied to output buffer 11 for testing. TSTD can be formed in any desired pattern by an external circuit.

Figure 4:
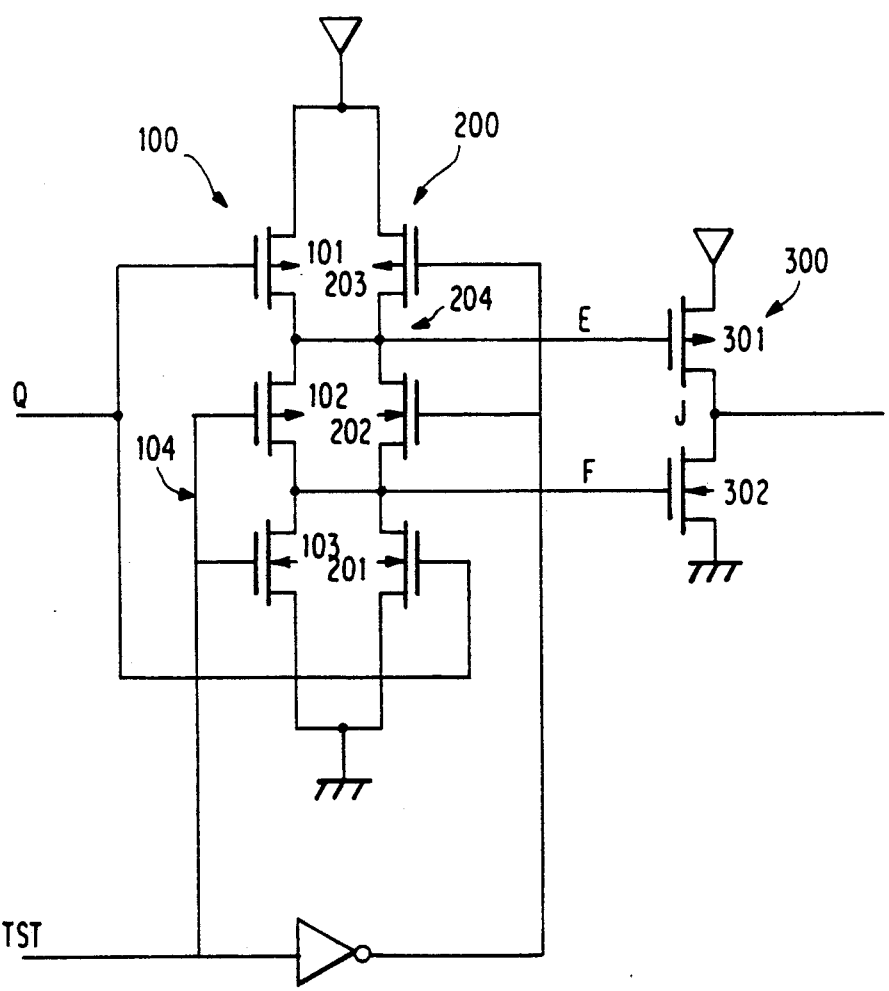
FIG. 4 is a logic diagram of three-state buffer 14 in the test circuit shown in FIG. 3.

Three state buffer 14 may be of a conventional type. FIG. 4 is a logic diagram of three-state buffer 14 used in this embodiment. Hereafter, P- and N- channel MOSFETs are referred to as P and N MOSs, respectively. Three-state buffer 14 is basically composed of a first circuit 100 and a second circuit 200 connected in parallel, and a third circuit 300. Circuit 100 has P MOS 101 and C MOS 104 connected in cascode, the source of P MOS 101 being connected to the positive electrode of the power supply and the lower-side source of C MOS 104 (the source of N NOS 103) being connected to the ground terminal. Similarly, but reversely connected in cascode, circuit 200 has C MOS 204 and N MOS 201 with the upperside source of C MOS 204 (the source of P MOS 203) connected to the positive electrode of the power supply and the source of N MOS 201 connected to the ground terminal. Control signal TST and the inverted control signal are applied to the gates of C MOSs 104 and 204, respectively. Logic signal Q is applied to both P MOS 101 and N MOS 201, and the drains of P MOSs 101 and 203 are connected together to provide signal E, and the drains of N NOSs 103 and 201 are connected together to provide signal F. Circuit 300 is a C MOS composed of P MOS 301 and N MOS 302 with the gates supplied with signals E and F, respectively. The junction J of the two MOSs provides the output of three-state buffer 14.

When TST is at logic 1, it forces C MOS 104 to have P MOS 102 turned off and N NOS 103 turned on, and also C MOS 204 to have P MOS 203 turned on and N NOS 202 turned off, whereby MOSs 102 and 202, both in off-state, electrically separate MOSs 101 and 203 (the upper side of circuits 100 and 200) from MOSs 103 and 201 (the lower side of circuits 100 and 200) to provide separate signals E and F, and N MOS 103 and P MOS 203, both in on-state, short-circuit the channels of N MOS 201 and P MOS 101, respectively, to provide high-level signal E and low-level signal F regardless of logic signal Q. High-level signal E and low-level signal F cause P MOS 301 and N MOS 302, respectively, to turn off, thereby forcing the output of three-state buffer 14 to take high-impedance state.

When TST is at logic 0, it causes MOSs 102, 202 to turn on and N MOS 103 and P MOS 203 to turn off. As a result, the drains of MOSs 101 and 203 are substantially short-circuited to the drains of MOSs 103 and 201 to combine signals E and F into one internal signal. Accordingly, circuits 100 and 200 act as an input buffer for logic signal Q composed of P MOS 101 and N MOS 201 connected in cascode through the substantially short-circuited drains of the two MOSs 101 and 201, and circuit 300 acts as an output buffer for the internal signal. In this way, three-state buffer 14 provides an output of high-impedance state when TST is at logic 1, and acts as a two-state buffer when TST is at logic 0.

Figure 1:
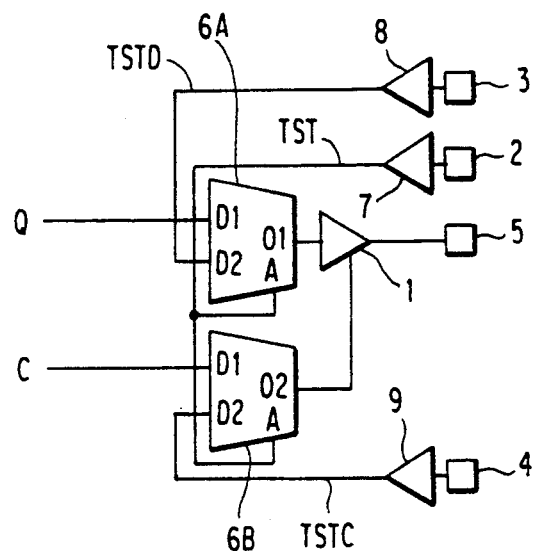
FIG. 1 is a block diagram of a semiconductor integrated circuit provided with a conventional test circuit for testing an output buffer.
Figure 2:
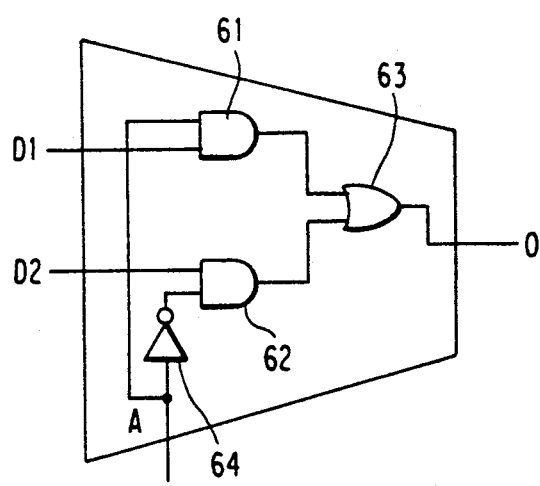
FIG. 2 is a block diagram of a conventional multiplexer provided in the test circuit in FIG. 1.

In the test circuit above, since a multiplexer is not present on the transmission line of logic signal Q, logic signal Q can be transmitted without a delay due to the multiplexer, which allows a shorter transmission time of logic signal Q in the output mode. For reference, the transmission time of the test circuit with the multiplexer, as shown in FIG. 1, is 2.3 nanoseconds, and the corresponding transmission time in the circuit according to this embodiment, in contrast, is 1.5 nanoseconds.

Figure 5:
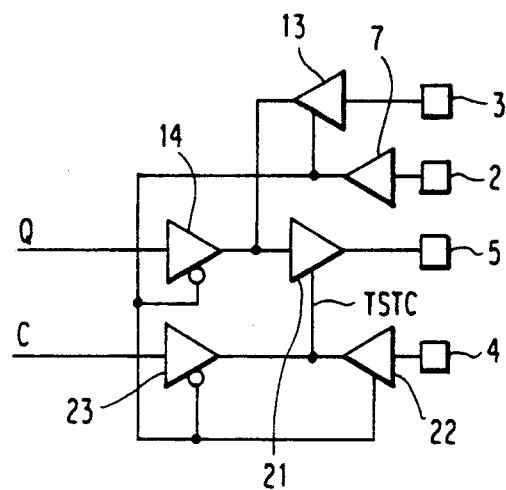
FIG. 5 is a block diagram of a second embodiment of the semiconductor integrated circuit according to the present invention for testing a three-state output buffer.

The test circuit described above is applicable to a test of three-state output buffer. FIG. 5 is a block diagram of a second embodiment of a semiconductor integrated circuit provided with a test circuit for testing three-state output buffer 21 according to the present invention. In the test circuit, two three-state buffers 22 and 23 along with test buffer-control signal terminal 4 are added to the circuit shown in FIG. 3 to supply a control signal to three-state output buffer 21. Hereafter the test buffer-control signal is referred to as TSTC. TSTC terminal 4 is identical with that already shown in FIG. 1. Three-state buffer 22 is essentially an input buffer for TSTC and transmits TSTC supplied from a desired external circuit into the control input of three-state output buffer 21 to be tested. The control input of three-state input buffer 22 is coupled to input buffer 7. As a result, three-state input buffer 22 is controlled so that it transmits TSTC to the control input of three-state output buffer 21 when TST is at logic 1 (the test mode) and takes a high-impedance state when TST is at logic 0 (the output mode). Similarly, three-state buffer 23 is adapted for transmitting control signal C to the control input of three-state output buffer 21 when TST is at logic 0 and taking a high-impedance state when TST is at logic 1.

In operation, in the output mode three-state buffers 13 and 22 are inhibited from transmitting TSTD and TSTC, respectively, and logic signal Q is transmitted from the internal logic circuit to a predetermined external circuit through three-state buffer 14, three-state output buffer 21 and signal output terminal 5, in response to a logic level of control signal C. In the test mode, three-state buffers 14 and 23 are inhibited from transmitting logic signal Q and control signal C, respectively, and TSTD is allowed to transmit through three-state buffer 13 to three-state output buffer 21 to be tested in response to a logic level of TSTC, thereby enabling a test of three-state output buffer 21 using TSTD. In this test circuit, the transmission time is substantially the same as that in the test circuit shown in FIG. 3.

Figure 6:
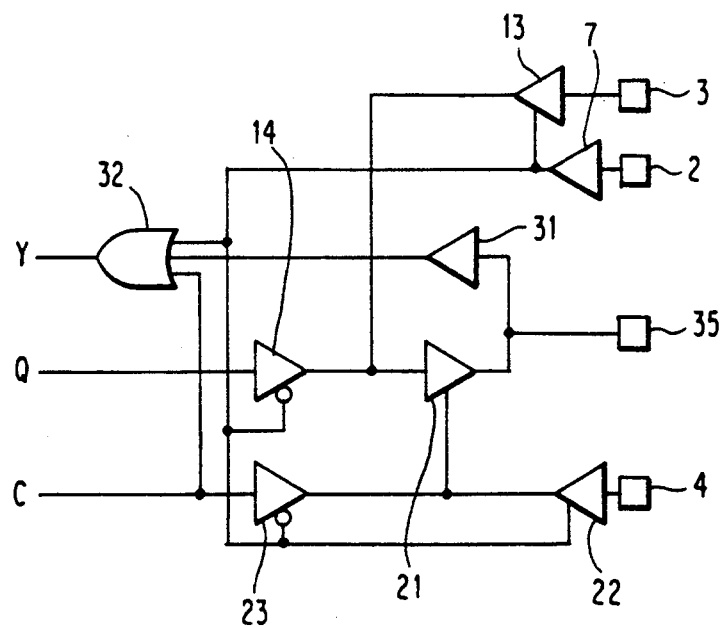
FIG. 6 is a block diagram of a third embodiment of the semiconductor integrated circuit according to the present invention for testing a bidirectional buffer.

Referring now to FIG. 6, a third embodiment will be given below. In this embodiment, a buffer to be tested is an input/output buffer, or a bidirectional buffer, connected in a bidirectional semiconductor integrated circuit. For a bidirectional transmission, input buffer 31 and OR gate 32 are added to the circuit shown in FIG. 5. The input of input buffer 31 is connected to both the output of three-state output buffer 21 and input/output terminal 35, whereby input buffer 31 and three-state output buffer 21 constitute an input/output buffer.

Table 2 shows a truth table for the signals concerned. In the table, the state number designates the state of the test circuit.

TABLE 2

| State No. | Q | C | TST | TSTD | TSTC | Terminal 35 | Y | Mode |
|---|---|---|---|---|---|---|---|---|
| (1) | X | 0 | 0 | X | X | 1 | 1 | Input |
| (2) | X | 0 | 0 | X | X | 0 | 0 | |
| (3) | 1 | 1 | 0 | X | X | 1 | 1 | Output |
| (4) | 0 | 1 | 0 | X | X | 0 | 1 | |
| (5) | X | 0 | 0 | X | X | HZ | HZ | Input |
| (6) | X | X | 1 | 1 | 1 | 1 | 1 | Test |
| (7) | X | X | 1 | 0 | 1 | 0 | 1 | |
| (8) | X | X | 1 | X | 0 | HZ | 1 | |

The input/output buffer takes an input mode when output buffer 21 is controlled to take a high impedance by setting both control signal C and TST at logic 0 at the same time (states (1), (2)). In this mode, both logic signal Q and TSTD are shut off from input/output terminal 35, and an external signal supplied to input/output terminal 35 (logic 1 and logic 0 in states (1) and (2), respectively) transmits in the opposite direction through the input/output buffer to OR gate 32.

OR gate 32 receives three input signals, i.e. TST, control signal C and the external signal, and transmits the external signal only when the input/output buffer is in the input mode. Otherwise (in the output mode or the test mode), OR gate 32 delivers logic 1 regardless of the external signal (states (3), (4), (6), (7) and (8)), thereby screening the external signal from transmission.

When TST and control signal C are logic 0 and logic 1, respectively (states (3), (4)), the output mode is selected, and the logic signal Q is transmitted to input/output terminal 35 through the input/output buffer (actually output buffer 21). In this mode, the external signal supplied to input/output terminal 35 is screened off from the output of OR gate 32 (Y=1). When both TST and TSTC are set at logic 1, the test mode is selected, and TSTD is transmitted to output buffer 31 for the DC test. In this mode as well, the external signal supplied to input/output 35 is shut out from transmission through OR gate 32.

Although in this embodiment OR gate 32 is fed with TST, control signal C and the external signal, it is possible to feed the OR gate with inverted TST, TSTC and the external signal. In this case, the input mode is provided by setting TST and TSTC at logic 1 and 0, respectively.

In the bidirectional test circuit described above, there are provided three-state buffers 14, 21 on the transmission line of logic signal Q, and two-state buffer 31 and OR gate 32 are provided on the transmission line of the externally input signal. Consequently, the test circuit has a shorter transmission time than the test circuit shown in FIG. 1. Further, it is possible to carry out a DC test easily both in the input mode and in the test mode, in which logic states of the signals at input/output terminal 35 and the output of OR gate 32 are selected in accordance with the truth table shown in Table 2 by means of an appropriate combination of TST, TSTD, TSTC, and the external signal supplied to input/output terminal 35 in the input mode.

It is to be understood that variations and modifications of the semiconductor integrated circuit with a test circuit for testing an output buffer and a bidirectional buffer disclosed herein will be evident to those skilled in the art. It is intended that all such modifications and variations be included within the scope of the appended claims.

What is claimed is:

1. A test circuit for testing a three-state output buffer gate in a semiconductor integrated circuit provided with first and second means, said first means selecting one of a test data signal supplied form an external circuit and a logic data signal Q supplied from an internal logic circuit of the semiconductor integrated circuit, in response to an externally supplied selection signal, and delivering a selected data signal to a data input of the output buffer gate to be tested, and said second means selecting, in response to the selection signal, one of a test control signal supplied from the external circuit and a control signal C supplied form the internal logic circuit for controlling an output of the output buffer gate and delivering a selected control signal of the control input of the output buffer gate, wherein said first means comprises:

a first three-state buffer fate having a data input supplied with the test data signal, an output connected to the data input of the three-state output buffer gate, and a control input supplied with the selection signal, said first three-state buffer gate being controlled to be in a high-impedance state when the selection signal is at a first logic level, and to transmit the test data signal to the output buffer gate when the selection signal is at a second logic level; and a second three-state buffer gate having a data input supplied with the logic data signal Q, an output connected to the data input of the three-state output buffer gate and a control input supplied with the selection signal, said second three-state buffer gate being controlled to transmit the logic data signal Q to the output buffer gate when the selection signal is at the first logic level, and to be in a high-impedance state when the selection signal is at the second logic level, and said second means comprises:

a third three-state buffer gate having a data input supplied with the control signal C, an output connected to the control input of the three-state output buffer gate a, and a control input supplied with the selection signal, said third three-stage buffer gate being controlled to transmit the control signal C to the control input of the three-state output buffer gate when the selection signal is at the first logic level, and to be in a high-impedance state when the selection signal is at a second logic level, and a fourth three-state buffer gate having a data input supplied with the test control signal, an output connected to the control input of the output buffer gate, and a control input supplied with the selection signal, said fourth three-state buffer gate being controlled to be in a high-impedance state when the selection signal is at the first logic level, and to transmit the test control signal to the control input of the output buffer gate when the selection signal is at the second logic level.

2. A test circuit as claimed in claim 1, wherein the test circuit further includes an input buffer gate for transmitting an externally supplied data signal in the direction opposite to the transmitting direction of the logic data signal Q, said input buffer gate having a data input connected to the output of the three-state output buffer gate, and a gate mean which allows the output of the input buffer gate to be transmitted only when either the logic data signal Q nor the test data signal is delivered from the output buffer gate.

* * * * *